(12) United States Patent
Egashira et al.

(10) Patent No.: US 9,590,829 B2
(45) Date of Patent: Mar. 7, 2017

(54) MODULATED SIGNAL GENERATING DEVICE AND WIRELESS DEVICE

(71) Applicant: Kabushiki Kaisha Toshiba, Minato-ku (JP)

(72) Inventors: Yoshimasa Egashira, Kawasaki (JP); Keiichi Yamaguchi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/882,745

(22) Filed: Oct. 14, 2015

(65) Prior Publication Data

US 2016/0226685 A1    Aug. 4, 2016

(30) Foreign Application Priority Data

Feb. 2, 2015  (JP) .................................. 2015-018084

(51) Int. Cl.
  *H04L 27/04*  (2006.01)
  *H04B 1/04*  (2006.01)
  *H03C 1/00*  (2006.01)

(52) U.S. Cl.
  CPC .............. *H04L 27/04* (2013.01); *H03C 1/00* (2013.01); *H04B 1/0475* (2013.01)

(58) Field of Classification Search
  CPC .............. H04L 27/34; H04L 27/3494; H04L 2025/0342; H04L 27/363; H04L 27/04; H03F 1/3241; H03C 1/00; H04B 1/0475
  (Continued)

(56) References Cited

U.S. PATENT DOCUMENTS 5,222,246 A * 6/1993 Wolkstein ............... H03F 3/602
                                             330/107
5,590,155 A * 12/1996 Yasuda .................. H03M 3/504
                                             332/103

(Continued)

FOREIGN PATENT DOCUMENTS

JP          3545203       7/2004
JP       2014-68191       4/2014

OTHER PUBLICATIONS

Zhong Du et al. "Reduced Switching-Frequency Active Harmonic Elimination for Multilevel Converters",IEEE Transactions on Industrial Electronics, vol. 55, No. 4, Apr. 2008, 10 pages.

*Primary Examiner* — Freshteh N Aghdam
(74) *Attorney, Agent, or Firm* — Oblon, McClelland, Maier & Neustadt, L.L.P.

(57) ABSTRACT

According to an embodiment, the modulated signal generating device modulates an input signal and generates an output signal. The modulated signal generating device includes a plurality of amplifiers, a combiner, a determining unit and a control signal generating unit. The plurality of amplifiers connects in parallel with one another and each configures to drive based on a control signal and to generate amplified signals. The combiner configures to combine the amplified signals and to obtain the output signal having a stepwise waveform. The determining unit configures to determine number of amplifiers to be driven based on a value of the input signal in a period shorter than a period of the input signal. The control signal generating unit configures to select zero or more amplifiers to be driven from among the amplifiers, based on the number of amplifiers determined by the determining unit, the value of the input signal, and a fluctuation in the value of the input signal, and to generate the control signal for driving the selected amplifier.

10 Claims, 11 Drawing Sheets

(58) Field of Classification Search
USPC .................................................. 375/295, 297
See application file for complete search history.

(56) References Cited

U.S. PATENT DOCUMENTS

| | | | |
|---|---|---|---|
| 6,175,512 B1 | 1/2001 | Hagihara et al. | |
| 6,252,785 B1 | 6/2001 | Hagihara et al. | |
| 6,473,013 B1* | 10/2002 | Velazquez | H03M 1/1215 |
| | | | 341/118 |
| 7,409,010 B2* | 8/2008 | McHenry | H03F 1/3229 |
| | | | 375/296 |
| 7,505,747 B2* | 3/2009 | Solum | H03F 3/211 |
| | | | 370/318 |
| 9,209,758 B2* | 12/2015 | Briffa | H03G 3/3042 |
| 2008/0013645 A1* | 1/2008 | Muto | H04L 25/0274 |
| | | | 375/297 |
| 2014/0348035 A1* | 11/2014 | Corman | H01Q 3/26 |
| | | | 370/278 |
| 2015/0008982 A1* | 1/2015 | Huang | H03F 1/3205 |
| | | | 330/260 |
| 2015/0015329 A1* | 1/2015 | Wilson | H03F 1/0277 |
| | | | 330/251 |

* cited by examiner

MODULATED SIGNAL GENERATING
DEVICE AND WIRELESS DEVICE

CROSS-REFERENCE TO RELATED
APPLICATION(S)

This application is based upon and claims the benefit of priority from Japanese Patent Application No. 2015-018084, filed on Feb. 2, 2015; the entire contents of which are incorporated herein by reference.

FIELD

Embodiments described herein relate generally to a modulated signal generating device and a wireless device.

BACKGROUND

A method of generating a modulated signal using a modulated signal generating device that has a plurality of amplifiers aligned in parallel is known as a method of transmitting a modulated signal generated by superimposing a data signal on a carrier signal, such as medium-frequency broadcasting. The modulated signal generating device generates a modulated signal by performing on-off control on the amplifiers according to the frequency of the carrier signal and combining outputs from the respective amplifiers. The modulated signal generating device performs on-off control on the number of amplifiers corresponding to an amplitude value of the data signal, thereby obtaining a modulated signal having undergone amplitude modulation.

The above-described modulated signal generating device, however, performs on-off control on the amplifiers according to the frequency of the carrier signal, and the signal waveform of the modulated signal thus forms a rectangular waveform having the same frequency as that of the carrier signal. When a modulated signal is transmitted in a rectangular waveform, a band-pass filter is needed in order to remove unnecessary harmonic components from the modulated signal.

DETAILED DESCRIPTION

According to an embodiment, the modulated signal generating device modulates an input signal and generates an output signal. The modulated signal generating device includes a plurality of amplifiers, a combiner, a determining unit and a control signal generating unit. The plurality of amplifiers connects in parallel with one another and each configures to drive based on a control signal and to generate amplified signals. The combiner configures to combine the amplified signals and to obtain the output signal having a stepwise waveform. The determining unit configures to determine number of amplifiers to be driven based on a value of the input signal in a period shorter than a period of the input signal. The control signal generating unit configures to select zero or more amplifiers to be driven from among the amplifiers, based on the number of amplifiers determined by the determining unit, the value of the input signal, and a fluctuation in the value of the input signal, and to generate the control signal for driving the selected amplifier.

Various embodiments will be described in detail below with reference to the accompanying drawings.

First Embodiment

Figure 1:
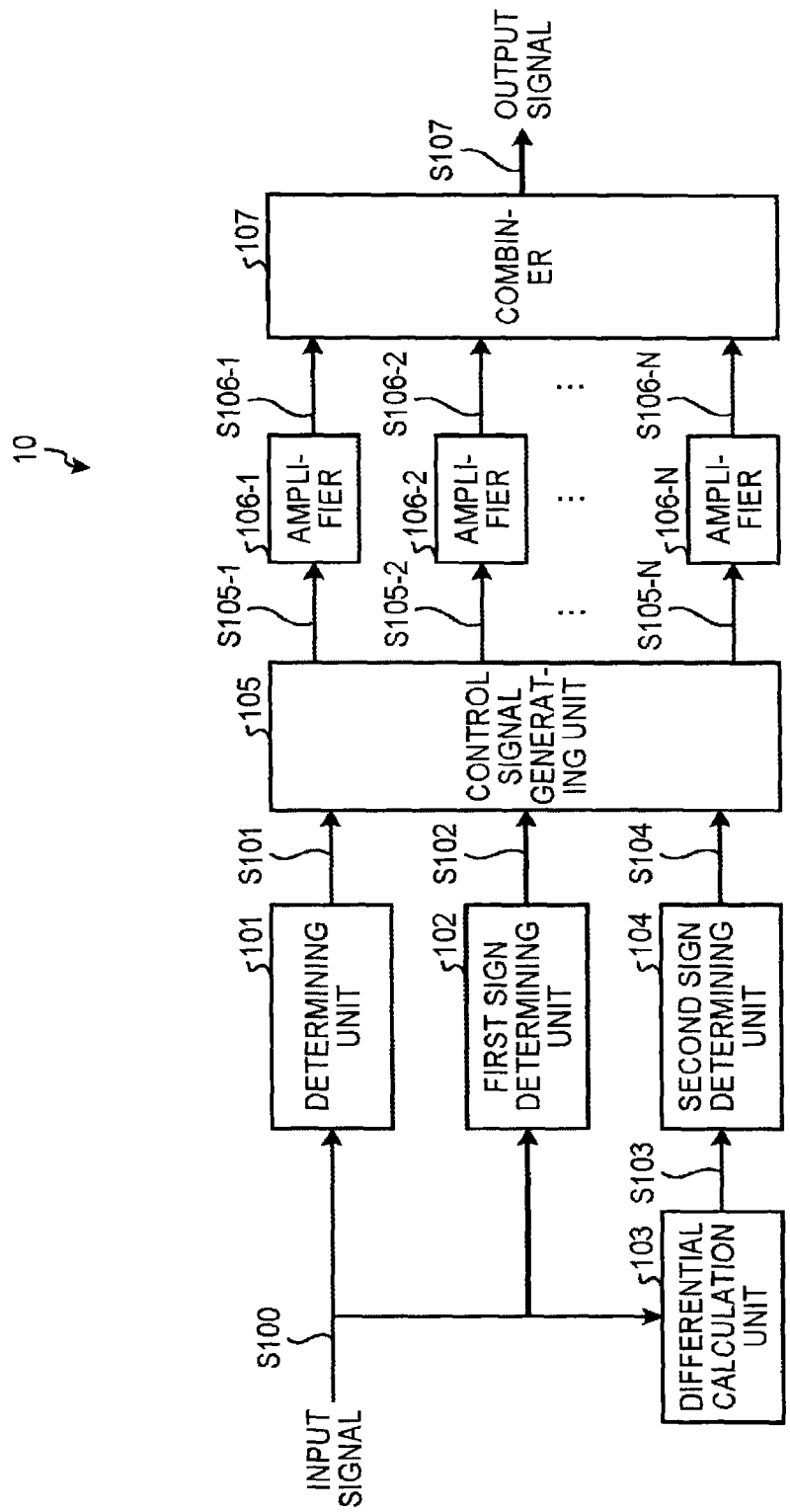
FIG. 1 is a drawing that illustrates a modulated signal generating device according to a first embodiment.

A modulated signal generating device 10 according to a first embodiment will be described with reference to FIG. 1. FIG. 1 is a drawing that illustrates the modulated signal generating device 10 according to the embodiment. The modulated signal generating device 10 includes a determining unit 101, a first and a second sign determining units 102 and 104, a differential calculation unit 103, a control signal generating unit 105, first to $N^{th}$ amplifiers 106-1 to 106-N (N is a natural number, and the amplifiers may be hereinafter referred to as amplifiers 106, collectively), and a combiner 107 combining first to $N^{th}$ amplified signals S106-1 to S106-N (hereinafter may be referred to as amplified signals S106, collectively) output from the first to the $N^{th}$ amplifiers 106-1 to 106-N, respectively.

The determining unit 101 determines the number of amplifiers 106 to be driven based on the amplitude value of an input signal S100. For example, when the input signal S100 is input, the determining unit 101 calculates the average amplitude value of the input signal S100 in a period T2 (see FIG. 3) shorter than a period T1 of the input signal S100. The period T1 corresponds to a half of a period (the reciprocal of the frequency of the input signal S100) of the input signal S100.

The determining unit 101 determines the number of amplifiers to be driven from among the first to the $N^{th}$ amplifiers 106-1 to 106-N according to the calculated average amplitude value. The determining unit 101 outputs a signal S101 indicating the determined number to the control signal generating unit 105. The amplitude value used for determining the number of amplifiers 106 to be driven is not limited to an average amplitude value, and examples of the amplitude value may include an amplitude value of the input signal S100 at the time the period T2 starts. A method of determining the number of amplifiers 106 will be later described in detail with reference to FIG. 3.

When the input signal S100 is input, the first sign determining unit 102 determines the sign of the input signal S100 based on the value of the input signal S100. Specifically, the first sign determining unit 102 determines the sign of the input signal S100 to be plus when the input signal S100 indicates a positive value, whereas the first sign determining unit 102 determines the sign of the input signal S100 to be when the input signal S100 indicates a negative value. The first sign determining unit 102 has, for example, a comparator (not illustrated) and determines the sign of the input signal S100 by comparing the input signal S100 with a reference signal using the comparator.

The first sign determining unit 102 generates a signal S102 indicating the sign of the input signal S100 and outputs the signal S102 to the control signal generating unit 105. The signal S102 is a binary signal that indicates, for example, the plus sign of the input signal S100 as "+1" and the minus sign as "−1".

The differential calculation unit 103 calculates a differential value by differentiating the input signal S100 and generates a differential signal S103. The differential calculation unit 103 has, for example, a delay device (not illustrated) and generates the differential signal S103 by delaying the input signal S100 when the input signal S100 is input. The differential calculation unit 103 outputs the generated differential signal S103 to the second sign determining unit 104.

The second sign determining unit 104 determines whether the value of the input signal S100 is increasing or decreasing. When the second sign determining unit 104 receives the differential signal S103 from the differential calculation unit 103, the second sign determining unit 104 determines whether the value of the input signal S100 is increasing or decreasing by determining the sign of the differential signal S103.

Specifically, the second sign determining unit 104 determines that when the differential signal S103 indicates a positive value, the sign of the differential signal S103 is plus and the value of the input signal S100 is thus increasing. Conversely, the second sign determining unit 104 determines that when the differential signal S103 indicates a negative value, the sign of the differential signal S103 is minus and the value of the input signal S100 is thus decreasing. The second sign determining unit 104 has, for example, a comparator (not illustrated) and determines the sign of the differential signal S103 by comparing the differential signal S103 with a reference signal using the comparator.

The second sign determining unit 104 generates the sign of the differential signal S103, that is, a signal S104 indicating the fluctuation in the value of the input signal S100 and outputs the signal S104 to the control signal generating unit 105. The signal S104 is a binary signal that indicates, for example, the plus sign of the differential signal S103, which means an increase in the value of the input signal S100, as "+1" and the minus sign of the differential signal S103, which means a decrease in the value of the input signal S100, as "−1".

In the above description, the second sign determining unit 104 determines the fluctuation in the input signal S100 based on the differential signal S103 calculated by the differential calculation unit 103; however, the second sign determining unit 104 does not necessarily make a determination based on the differential signal S103. For example, the second sign determining unit 104 may determine the fluctuation in the input signal S100 by using information such as the period of the input signal S100 and the maximum amplitude value of the same.

The control signal generating unit 105 generates first to $N^{th}$ control signals S105-1 to S105-N (hereinafter may be referred to as control signals S105, collectively) that perform on-off control on the first to the $N^{th}$ amplifiers 106-1 to 106-N. The control signal generating unit 105 selects zero or more amplifiers 106 to drive from among the first to the $N^{th}$ amplifiers 106-1 to 106-N based on the number of the amplified signals S106 combined by the combiner 107, the value of the input signal S100, and the fluctuation in the value of the input signal S100. The control signal generating unit 105 generates the control signal S105 for driving the determined amplifier 106.

The control signal generating unit 105 receives the signal S101 indicating the number of amplifiers 106 to be driven from the determining unit 101. The control signal generating unit 105 further receives the signal S102 indicating the sign of the input signal S100 from the first sign determining unit 102 and receives the signal S104 indicating the sign of the differential signal S103 from the second sign determining unit 104.

The control signal generating unit 105 determines zero or more amplifiers 106 to drive based on a combination of signals S101, S102, and S104. For example, the control signal generating unit 105 determines to drive as many amplifiers 106 as the number indicated by the signal S101 according to priority P given based on the combination of signals S102 and S104. The control signal generating unit 105 further determines which signal of a positive amplified signal S106 or a negative amplified signal S106 is output from the amplifier 106 determined to be driven based on the signal S101.

The control signal generating unit 105 generates the control signal S105 indicating "+C" (C is a natural number) so as to provide on-control to the amplifier 106 from which the control signal generating unit 105 has determined to output the positive amplified signal S106 and generates the control signal S105 indicating "−C" so as to provide on-control to the amplifier 106 from which the control signal generating unit 105 has determined to output a negative amplified signal S106. The control signal generating unit 105 further generates the control signal S105 indicating "0" so as to provide off-control to the amplifier 106 that the control signal generating unit 105 has not determined to drive, in other words, has determined not to drive. In this manner, the control signal generating unit 105 generates control signals S105 indicating three values of "+C, 0, −C".

Figure 2:
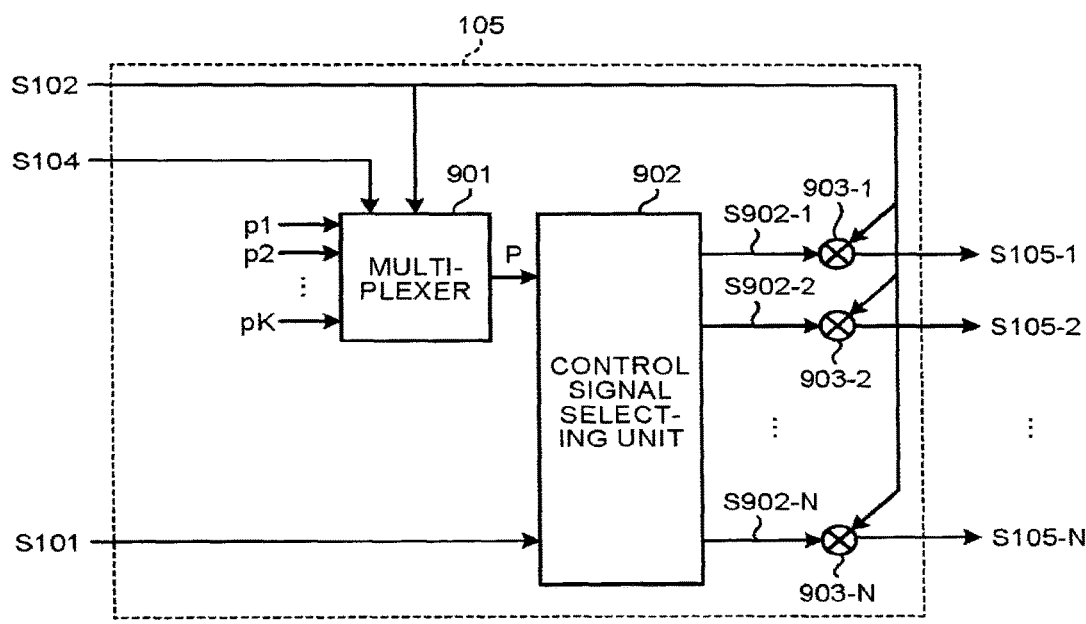
FIG. 2 is a drawing that illustrates the configuration of a control signal generating unit according to the first embodiment.

FIG. 2 illustrates an exemplary configuration of the control signal generating unit 105. FIG. 2 is a drawing that illustrates the configuration of the control signal generating unit 105 according to the embodiment. The control signal generating unit 105 illustrated in FIG. 2 generates the control signal S105 with the same period as the period T2 (see FIG. 3), based on which the determining unit 101 determines the number of amplifiers 106 to drive. In the example of FIG. 2, the control signal generating unit 105 has a multiplexer 901, a control signal selecting unit 902, and first to $N^{th}$ multipliers 903-1 to 903-N (hereinafter may be referred to as multipliers 903, collectively).

The multiplexer 901 determines the signal S102 input from the first sign determining unit 102 and the signal S104 input from the second sign determining unit 104 to be a control input and K vector signals p1 to pK (K is a natural number, and the signals may be hereinafter referred to as vector signals p, collectively) to be a data input.

Figure 3:
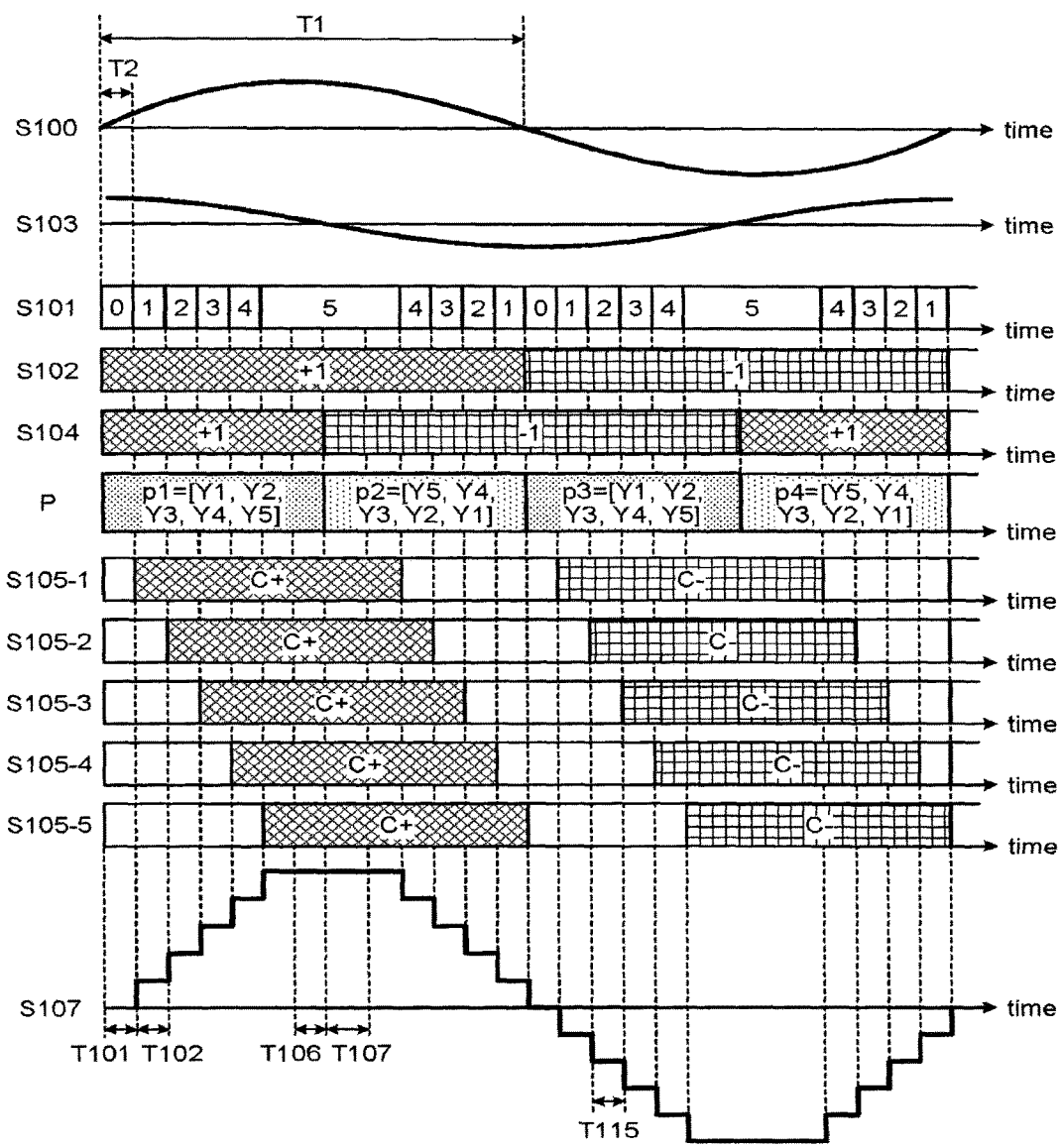
FIG. 3 is a drawing that illustrates a signal generated by each unit of the modulated signal generating device according to the first embodiment.

The vector signal p is a signal indicating a selection order for the amplifiers 106 and is represented, for example, in such a manner as the vector signal p1={Y1, Y2, Y3, Y4, Y5} (see FIG. 3). "Y1" to "Y5" included in each of the vector signals p1 to p4 are signals indicating, respectively, the first to the fifth amplifiers 106-1 to 106-5, in which the respective numbers indicate numbers of the amplifiers 106. For example, Y1 indicates the first amplifier 106-1, and Y3 indicates the third amplifier 106-3.

When the signals S102 and S104 are input from the first and the second sign determining units 102 and 104, the multiplexer 901 outputs any one of K vector signals p1 to pK to the control signal selecting unit 902 as a priority P according to the signals S102 and S104. The vector signals p1 to pK selected by the multiplexer 901 may be hereinafter referred to as priorities p1 to pK. The vector signal p may be stored in a memory unit (not illustrated) of the control signal generating unit 105 and output from the memory unit to the multiplexer 901. Alternatively, the vector signal p may be output from an upstream processing unit (not illustrated).

The control signal selecting unit 902 receives an input of the vector signal p indicating the priority P from the multiplexer 901 and receives the signal S101 indicating the number of amplifiers 106 to be driven from the determining unit 101. The control signal selecting unit 902 selects as many amplifiers 106 as the number indicated by the signal S101 as amplifier(s) 106 to be driven in decreasing order of the priority P indicated by the vector signal p. The selection method will be described in detail with reference to FIG. 3.

The control signal selecting unit 902 generates first to $N^{th}$ selection signals S902-1 to S902-N (hereinafter may be referred to as selection signals S902, collectively) according to the selection result. The control signal selecting unit 902 generates a signal indicating "C" as the selection signal S902 corresponding to the amplifier 106 selected to be driven and generates a signal indicating "0" as the selection signal S902 corresponding to the amplifier 106 unselected, which means selected not to be driven. In this manner, the control signal selecting unit 902 generates a binary selection signal S902 indicating "C or 0" according to the selection result and outputs the signal to the multiplier 903.

The first to the $N^{th}$ selection signals S902-1 to S902-N are input to a first to an $N^{th}$ multipliers 903-1 to 903-N, respectively. Furthermore, the signal S102 indicating the sign of the input signal S100 is input to each of the first to the $N^{th}$ multipliers 903-1 to 903-N.

The first to the $N^{th}$ multipliers 903-1 to 903-N multiply, respectively, the first to the $N^{th}$ selection signals S902-1 to S902-N by the signal S102 and generate a first to an $N^{th}$ control signals S105-1 to S105-N. The first to the $N^{th}$ multipliers 903-1 to 903-N output, respectively, the generated first to $N^{th}$ control signals S105-1 to S105-N to the first to the $N^{th}$ amplifiers 106-1 to 106-N.

Referring back to FIG. 1, the first to the $N^{th}$ amplifiers 106-1 to 106-N generate a first to an $N^{th}$ amplified signals S106-1 to S106-N based on the first to the $N^{th}$ control signals S105-1 to S105-N, respectively. The first to the $N^{th}$ amplifiers 106-1 to 106-N thereafter output the generated first to $N^{th}$ amplified signals S106-1 to S106-N to the combiner 107.

The amplifier 106 outputs, for example, the amplified signal S106 indicating "+C" upon input of the control signal S105 indicating "+C" and outputs the amplified signal S106 indicating "−C" upon input of the control signal S105 indicating "−C". The amplifier 106 further outputs the amplified signal S106 indicating "0" upon input of the control signal S105 indicating "0".

The combiner 107 combines the first to the $N^{th}$ amplified signals S106-1 to S106-N output from the first to the $N^{th}$ amplifiers 106-1 to 106-N and generates an output signal S107.

An operation of the modulated signal generating device 10 according to the embodiment will now be described with reference to FIGS. 1 and 3. FIG. 3 is a drawing that illustrates a signal generated by each unit of the modulated signal generating device 10. A case of having five amplifiers 106, which means N=5, is now described.

The input signal S100 is input to each of the determining unit 101, the first sign determining unit 102, and the differential calculation unit 103. As illustrated in FIG. 3, such an input signal S100 is input that has a single frequency with identical maximum amplitude values.

The input signal S100 is converted into the signal S101 indicating the number of amplifiers 106 driven by the determining unit 101. If the amplitude value is the maximum, the determining unit 101 determines to drive all the amplifiers 106. In a term T106 illustrated in FIG. 3, the determining unit 101 determines to drive all of the first to the fifth amplifiers 106-1 to 106-5 and generates the signal S101 with the number of amplifiers M=5.

If the amplitude value of the input signal S100 is "0" as in a term T101 illustrated in FIG. 3, for example, the determining unit 101 determines to drive none of the amplifiers 106 and generates the signal S101 with the number of amplifiers M=0. In this manner, the determining unit 101 generates the signal S101 according to the amplitude value of the input signal S100. The signal S101 is output to the control signal generating unit 105.

The sign of the input signal S100 input to the first sign determining unit 102 is determined by whether the input signal S100 has a positive value or a negative value. Based on the determination made by the first sign determining unit 102, the input signal S100 is converted into the signal S102 and output to the control signal generating unit 105. When the input signal S100 illustrated in FIG. 3 is input to the first sign determining unit 102, the first sign determining unit 102 generates the signal S102 the sign of which reverses in a period T1, which is a half of the period of the input signal S100.

The input signal S100 input to the differential calculation unit 103 undergoes differential calculation and is converted into the differential signal S103. The differential signal S103 is output to the second sign determining unit 104. When the differential calculation unit 103 performs differential calculation on the input signal S100 illustrated in FIG. 3, such a differential signal S103 is generated that has the same frequency as a single frequency with the phase different by $\pi/4$.

The sign of the differential signal S103 input to the second sign determining unit 104 is determined by whether the value is positive or negative. The differential signal S103 is converted into the signal S104 based on the determination made by the second sign determining unit 104 and is output to the control signal generating unit 105. When the differential signal S103 illustrated in FIG. 3 is input to the second sign determining unit 104, the second sign determining unit 104 generates the signal S104 the sign of which reverses in the term T1, which is a half of the term of the input signal S100 with the phase different from the signal S102 by $\pi/4$.

Signals S101, S102, and S104 are input to the control signal generating unit 105. The control signal generating unit 105 selects the priority P corresponding to a combination of the signals S102 and S104. Specifically, if the combination of the signals S102 and S104 is (+1, +1), the control signal generating unit 105 selects the vector signal p1={Y1, Y2, Y3, Y4, Y5} as the priority P. If the combination of the signals S102 and S104 is (+1, −1), the control signal generating unit 105 selects the vector signal p2={Y5, Y4, Y3, Y2, Y1}. In the case of (−1, −1), the control signal generating unit 105 selects the vector signal p3={Y1, Y2, Y3, Y4, Y5}, and in the case of (−1, +1), the control signal generating unit 105 selects the vector signal p4={Y5, Y4, Y3, Y2, Y1}.

The control signal generating unit 105 selects the priority P according to the signals S102 and S104. The control signal generating unit 105 determines, in each term of the period T2, as many amplifiers 106 as the number indicated by the signal S101 to be amplifier(s) 106 to be driven in decreasing order from the highest priority included in the selected priority P.

In the example illustrated in FIG. 3, in a term T102, for example, the signal S101 indicates "1", and the signals S102 and S104 indicate "+1". The control signal generating unit 105 selects the priority P1={Y1, Y2, Y3, Y4, Y5} based on the combination (+1, +1) of the signals S102 and S104. The control signal generating unit 105 selects zero or more amplifiers 106 in decreasing order from the highest priority in the priority p1 based on the signal S101. In other words, the control signal generating unit 105 determines to drive the first amplifier 106-1.

The control signal generating unit 105 generates the first control signal S105-1 for controlling the first amplifier 106-1 determined to be driven according to the signal S102. Specifically, the signal S102 indicates "+1", and the control signal generating unit 105 thus generates the first control signal S105-1 indicating "+C". Furthermore, the control signal generating unit 105 determines not to drive the second to the fifth amplifiers 106-2 to 106-5 and generates the first to the fifth control signals S105-2 to 105-5 indicating "0".

In the term T106 in FIG. 3, the signal S101 indicates "5", and the control signal generating unit 105 thus selects five amplifiers 106 in decreasing order from the highest priority in the priority p1. In other words, the control signal generating unit 105 determines to drive the first to the fifth amplifiers 106-1 to 106-5 and generates the first to the fifth control signals S105-1 to S105-5 indicating "+C".

The signal S104 changes from "+1" to "−1" in a term T107 in FIG. 3. The control signal generating unit 105 selects the priority p2={Y5, Y4, Y3, Y2, Y1} based on the combination (+1, −1) of the signals S102 and S104. The control signal generating unit 105 selects five amplifiers 106 in decreasing order from the highest priority in the priority p2. The control signal generating unit 105 determines to drive the first to the fifth amplifiers 106-1 to 106-5 and generates the first to the fifth control signals S105-1 to S105-5 indicating "+C".

In a term T115 in FIG. 3, the signal S101 indicates "2", the signal S102 indicates "−1", and the signal S104 indicates "−1". The control signal generating unit 105 selects the priority p3={Y1, Y2, Y3, Y4, Y5} based on the combination (−1, −1) of the signals S102 and S104. The control signal generating unit 105 selects two amplifiers 106 in decreasing order from the highest priority in the priority p3 according to the signal S101. In other words, the control signal generating unit 105 determines to drive the first and the second amplifiers 106-1 and 106-2.

The control signal generating unit 105 generates the first and the second control signals S105-1 and S105-2 that control, respectively, the first and the second amplifiers 106-1 and 106-2 determined to be driven according to the signal S102. Specifically, because the signal S102 indicates "−1", the control signal generating unit 105 generates the first and the second control signals S105-1 and S105-2 each indicating "−C". The control signal generating unit 105 determines not to drive the third to the fifth amplifiers 106-3 to 106-5 and generates the third to the fifth control signals S105-3 to S105-5 each indicating "0".

Based on the control signal S105 generated by the control signal generating unit 105, each amplifier 106 is driven and accordingly generates the amplified signal S106. The combiner 107 combines the amplified signal S106 generated by each amplifier 106, thereby obtaining the output signal S107 having a stepwise amplitude waveform as illustrated in FIG. 3.

As described above, with the modulated signal generating device 10, the determining unit 101 determines at least one amplifier 106 to drive in the period T2 shorter than the period T1 of the input signal S100, and the control signal generating unit 105 generates the control signal S105. With this process, the combiner 107 can combine the output signal S107 having a stepwise waveform, and the modulated signal generating device 10 can reduce harmonic components on the output signal S107 without using a band-pass filter.

Figure 4:
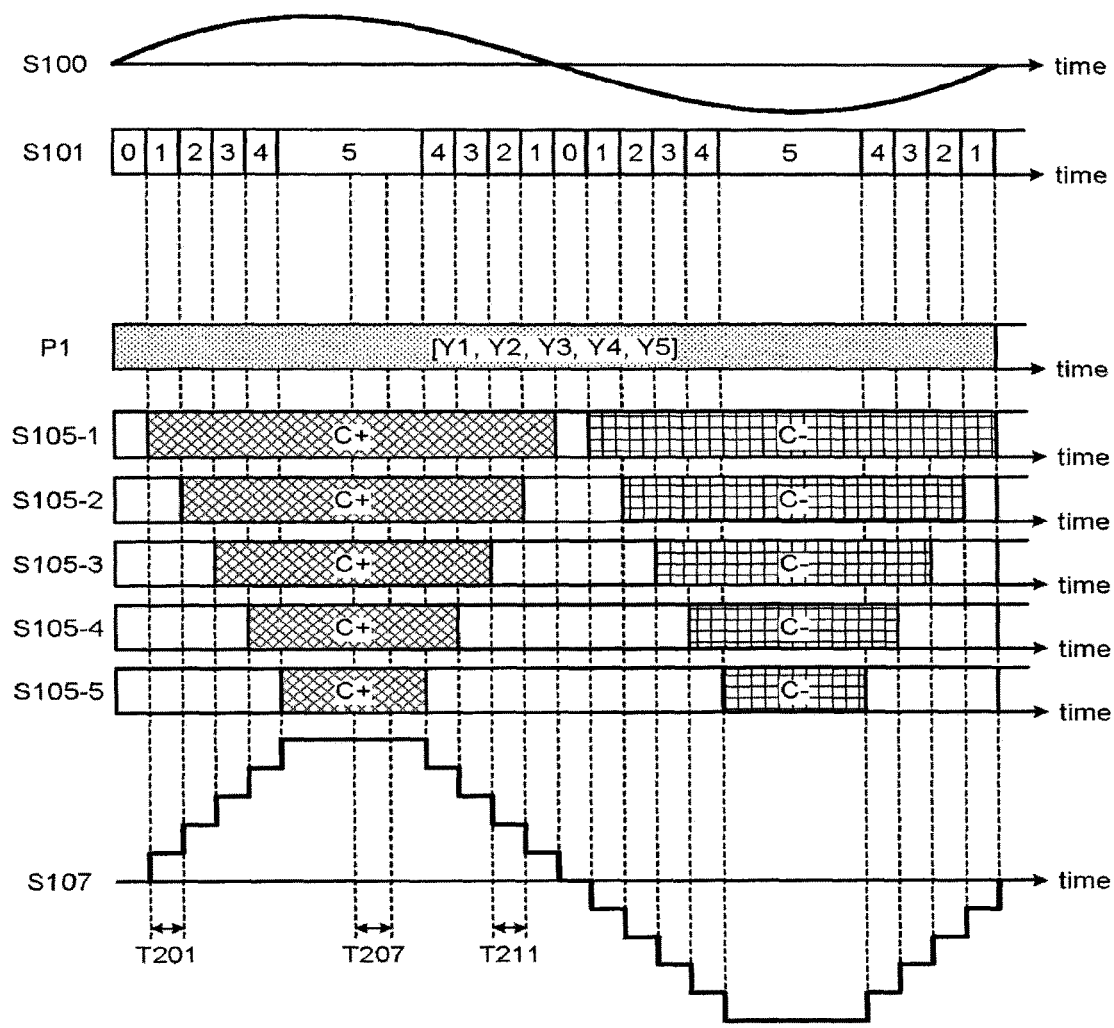
FIG. 4 is an explanatory drawing of the operation of the control signal generating unit according to the first embodiment.

The process in which the control signal generating unit 105 determines at least one amplifier 106 to be driven based on a plurality of priorities P will now be described with reference to FIGS. 3 and 4. FIG. 4 is an explanatory drawing of the operation of the control signal generating unit 105 according to the embodiment.

A case will be described with reference to FIG. 4 where the control signal generating unit 105 according to the embodiment determines zero or more amplifiers 106 to be driven based on a single priority P1. In FIG. 4, the priority P1 is represented by the vector signal p1={Y1, Y2, Y3, Y4, Y5}. As illustrated in FIG. 4, in determining zero or more amplifiers 106 to be driven based on the priority P1 alone, the control signal generating unit 105 does not need to determine which priority P is used, and neither the differential signal S103 nor the signal S102 is thus necessary.

The operation of the control signal generating unit 105 in each term in FIG. 4 will now be described. In a term T201, the signal S101 indicates "1". The control signal generating unit 105 selects one amplifier 106 (in this case, the first amplifier 106-1) according to the priority P1. Because the sign of the input signal S100 is plus, the control signal generating unit 105 generates the first control signal S105-1 indicating "+C".

Likewise, because the signal S101 indicates "5" in a term T207, the control signal generating unit 105 selects five amplifiers 106 (in this case, the first to the fifth amplifiers 106-1 to 106-5) according to the priority P1. Because the sign of the input signal S100 is plus, the control signal generating unit 105 generates the first to the fifth control signals S105-1 to S105-5 each indicating "+C".

If a single priority P1 is used as illustrated in FIG. 4, the control signal generating unit 105 determines zero or more amplifiers 106 to drive based on the priority P1 despite a decrease in the value of the input signal S100 in the term T207. The signal S101 indicates "2" in a term T211, for example, and the control signal generating unit 105 therefore selects two amplifiers 106 (in this case, the first and the second amplifiers 106-1 and 106-2) based on the priority P1.

As described above, when the control signal generating unit 105 determines zero or more amplifiers 106 to drive based on a single priority P1, the first amplifier 106-1 has the longest driving time, whereas the fifth amplifier 106-5 has the shortest driving time. With an increase in the driving time of the amplifier 106, the amount of heat generation increases, which is more likely to cause the breakdown of the amplifier 106. A single priority P1 as illustrated in FIG. 4 easily causes a difference in the driving time between the amplifiers 106, and this configuration is likely to cause the breakdown of a specific amplifier 106.

Conversely, as illustrated in FIG. 3, the control signal generating unit 105 according to the embodiment determines zero or more amplifiers 106 to drive based on a plurality of priorities P defined according to the value of the input signal S100 and the fluctuation in the input signal S100. This configuration can reduce a difference in the driving time between the amplifiers 106 and prevent an increase in the amount of heat generation in a specific amplifier 106. Consequently, this configuration prevents breakdown of a specific amplifier 106, thereby assuring a longer product life of the amplifier 106 and reducing the size of the cooling device for cooling the heat generated in the amplifier 106.

In the example illustrated in FIG. 4, the fifth amplifier 106-5 has the shortest driving time. In other words, the fifth control signal S105-5 has the shortest pulse width. The control signal S105 performs on-off control on the amplifier 106. A shorter pulse width of the control signal S105 is thus likely to cause larger distortion of the amplified signal S106 resulting from changing over of a switch for the on-off control.

Conversely, the control signal generating unit 105 according to the embodiment uses a plurality of priorities P as illustrated in FIG. 3. This configuration can reduce the difference in the driving time between the amplifiers 106 and can reduce the difference in the pulse width of the control signal S105. Consequently, this configuration is unlikely to shorten the pulse width of a specific control signal S105 and thus can reduce distortion of the amplified signal S106 resulting from changing over of a switch of the amplifier 106.

Figure 5:
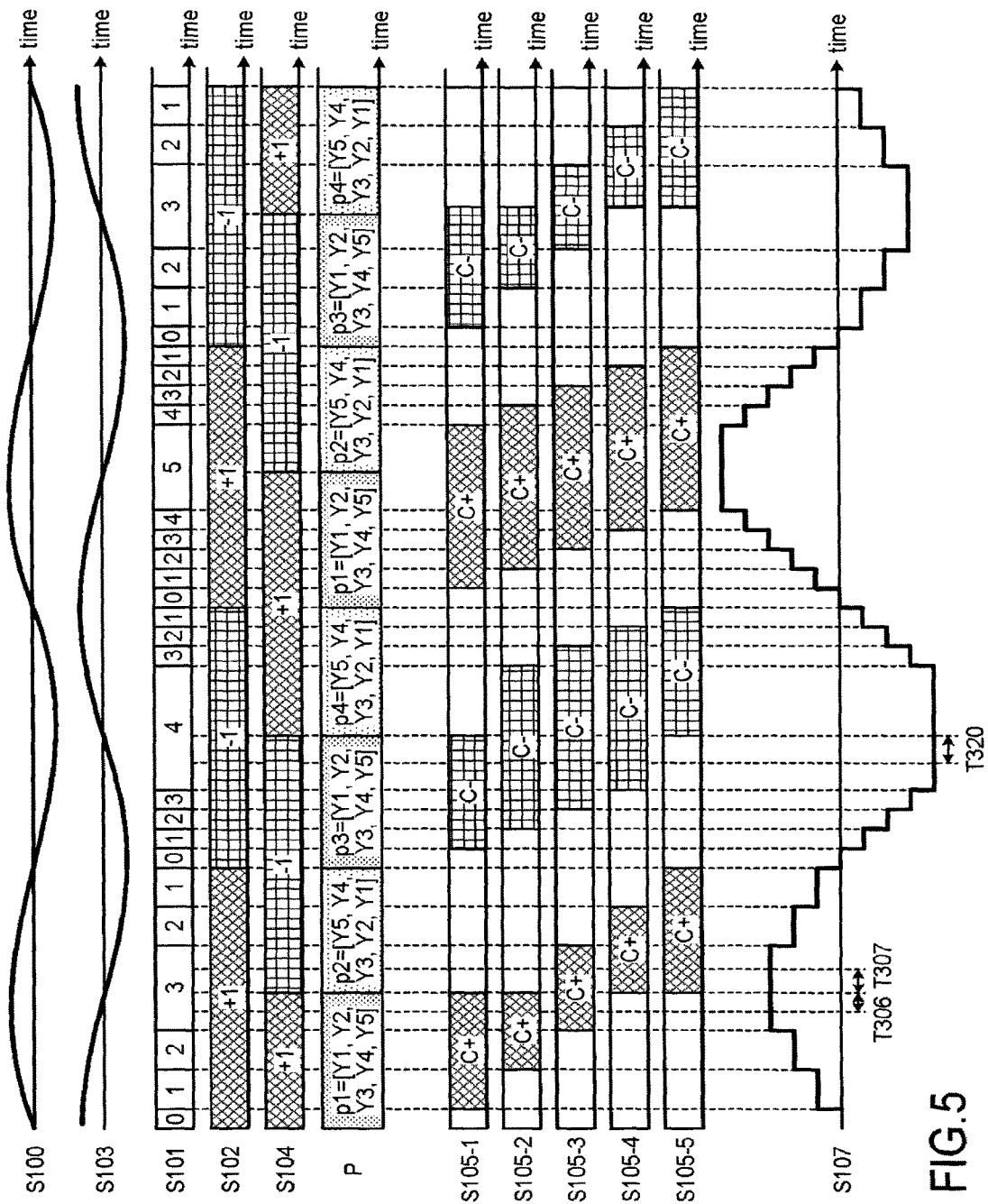
FIG. 5 is a drawing that illustrates a signal generated by each unit of the modulated signal generating device according to the first embodiment.

The operation of the modulated signal generating device 10 when the input signal S100 with its amplitude modulated is input will now be described with reference to FIG. 5. FIG. 5 is a drawing that illustrates a signal generated by each unit of the modulated signal generating device 10. Except that the input signal S100 with its amplitude modulated is input to the modulated signal generating device 10, the configuration and the operation are the same as those of the modulated signal generating device 10 illustrated in FIGS. 1 and 3.

The operation of the control signal generating unit 105 in each term in FIG. 5 will now be described. In a term T306, the determining unit 101 determines the number of driven amplifiers 106 to be "3" based on the input signal S100 as indicated by the signal S101. The first sign determining unit 102 determines the sign of the input signal S100 to be plus and generates the signal S102 indicating "+1". The second sign determining unit 104 determines that the input signal S100 is increasing because the sign of the differential signal S103 is plus and accordingly generates the signal S104 indicating "+1".

The control signal generating unit 105 selects the vector signal p1={Y1, Y2, Y3, Y4, Y5} based on the combination (+1, +1) of the signals S102 and S104 and further selects three amplifiers 106 (in this case, the first to the third amplifiers 106-1 to 106-3) according to the priority. The control signal generating unit 105 generates the first to the third control signals S105-1 to S105-3 each indicating "+C" based on the signal S102.

In a term T307 (see FIG. 5) next to the term T306, the sign of the differential signal S103 reverses from a plus to a minus, and the signal S104 in the term T307 thus indicates "−1". The control signal generating unit 105 selects the vector signal p2={Y5, Y4, Y3, Y2, Y1} based on the combination (+1, −1) of the signals S102 and S104 and further selects three amplifiers 106 (in this case, the third to the fifth amplifiers 106-3 to 106-5) according to the priority. The control signal generating unit 105 generates the third to the fifth control signals S105-3 to S105-5 each indicating "+C" based on the signal S102.

In a term T320 in FIG. 5, the signal S101 indicates "4", the signal S102 indicates "−1", and the signal S104 indicates "−1". The control signal generating unit 105 selects the vector signal p3={Y1, Y2, Y3, Y4, Y5} based on the combination (−1, −1) of the signals S102 and S104. The control signal generating unit 105 selects four amplifiers 106 in decreasing order from the highest priority included in the vector signal p3 based on the signal S101. In other words, the control signal generating unit 105 determines to drive the first to the fourth amplifiers 106-1 to 106-4. The control signal generating unit 105 thereafter generates the first to the fourth control signals S105-1 to S105-4 each indicating "+C" based on the signal S102.

Even when the input signal S100 is an amplitude-modulated signal, the modulated signal generating device 10 according to the embodiment can generate the output signal S107 having an amplitude waveform in the form of a pulse. Furthermore, even with the input signal S100 with its amplitude modulated, the control signal generating unit 105 determines zero or more amplifiers 106 to drive according to a plurality of priorities, which can reduce the difference in the driving time between the amplifiers 106 and the difference in the pulse width of the control signal S105.

As described above, the modulated signal generating device 10 according to the embodiment generates the output signal S107 having an amplitude waveform in the form of a pulse, thereby reducing the harmonic components without using a band-pass filter. The modulated signal generating device 10 determines zero or more amplifiers 106 to drive based on a plurality of priorities, thereby reducing the difference in the driving time between the amplifiers 106 and the difference in the pulse width of the control signal S105. This configuration can thus prevent breakdown of the amplifier 106 and reduce the distortion of the amplified signal S106 caused by switching.

First Modification

Figure 6:
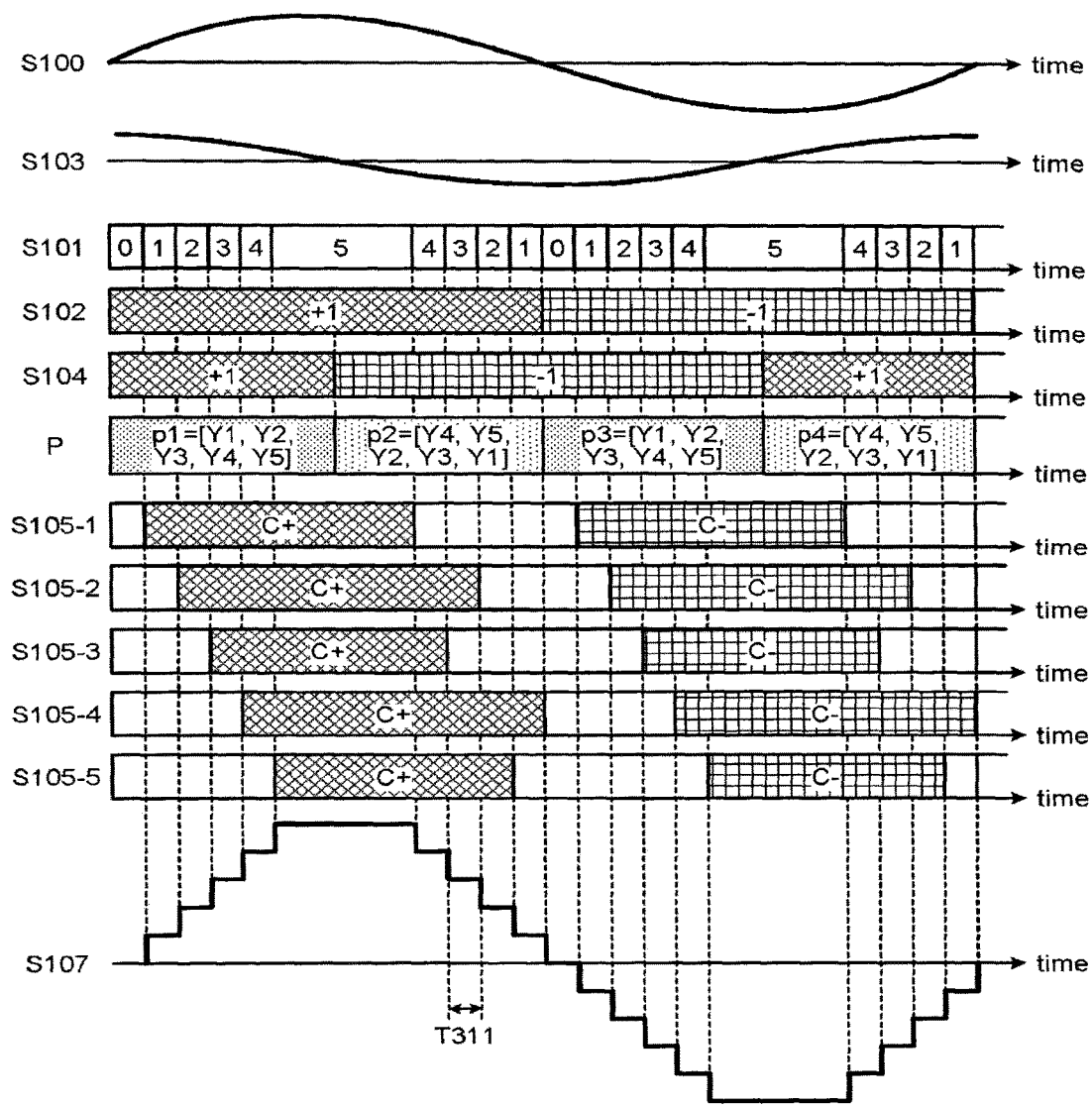
FIG. 6 is a drawing that illustrates a modification of the modulated signal generating device according to the first embodiment.

A first modification according to the embodiment will now be described with reference to FIG. 6. FIG. 6 is a drawing that illustrates a signal generated by each unit of the modulated signal generating device 10 according to the modification. The configuration and the operation of the modulated signal generating device 10 according to the modification are the same as those of the modulated signal generating device 10 illustrated in FIGS. 1 and 3 except the priority P used in determining zero or more amplifiers 106 to be driven.

In the priority P described in the first embodiment, the priorities p1 and p3 corresponding to combinations (+1, +1) and (−1, +1), in which the differential signal S103 has a plus sign, from among combinations of the signals S102 and S104 have a reverse order to the order of the priorities p2 and p4 corresponding to combinations (+1, −1) and (−1, −1) of the signals S102 and S104, in which the differential signal S103 has a minus sign.

In other words, in the modulated signal generating device 10 illustrated in FIG. 3, the vector signals p1 and p3 have the same signal (p1=p3={Y1, Y2, Y3, Y4, Y5}), and the vector signals p2 and p4 have the same signal (p2=p4={Y5, Y4, Y3, Y2, Y1}). In this case, the vector signals p1 and p3 have a reverse order to the priorities of the vector signals p2 and p4.

Conversely, in the priority P illustrated in FIG. 6, the priorities p1 and p3 corresponding to combinations (+1, +1) and (−1, +1), in which the differential signal S103 has a plus sign, from among combinations of the signals S102 and S104, do not have a reverse order to the priorities p2 and p4 corresponding to combinations (+1, −1) and (−1, −1), in which the differential signal S103 has a minus sign, from among the combinations of the signals S102 and S104.

In other words, in the modulated signal generating device 10 illustrated in FIG. 6, the priorities p1 and p3 have the same vector signal (p1=p3={Y1, Y2, Y3, Y4, Y5}), and the priorities p2 and p4 have the same vector signal (p2=p4={Y4, Y5, Y2, Y3, Y}). In this case, the vector signals p1 and p3 have an order different from the reverse order ({Y1, Y3, Y2, Y5, Y4}) to the priorities of the vector signals p2 and p4.

The operation of the control signal generating unit 105 in each term in FIG. 6 will now be described. In a term T311 in FIG. 6, for example, the signal S101, which is the number of driven amplifiers 106, indicates "3", the signal S102 indicates "+1", and the signal S104 indicates "−1". The control signal generating unit 105 selects the vector signal p2={Y4, Y5, Y2, Y3, Y1} based on the combination (+1, −1) of the signals S102 and S104. The control signal generating unit 105 selects three amplifiers 106 in decreasing order from the highest priority included in the vector signal p2 based on the signal S101. In other words, the control signal generating unit 105 determines to drive the second, the fourth, and the fifth amplifiers 106-2, 106-4, and 106-5.

Based on the signal S102, the control signal generating unit 105 thereafter generates the second, the fourth, and the fifth control signals S105-2, S105-4, and S105-5 controlling, respectively, the second, the fourth, and the fifth amplifiers 106-2, 106-4, and 106-5 determined to be driven. Specifically, because the signal S102 indicates "+1", the control signal generating unit 105 generates the second, the fourth, and the fifth control signals S105-2, S105-4, and S105-5 each indicating "+C".

In FIG. 6, a case has been described where the priorities p1 and p3 have the same vector signal (p1=p3={Y1, Y2, Y3, Y4, Y5}), whereas the priorities p2 and p4 have the same vector signal (p2=p4={Y4, Y5, Y2, Y3, Y1}). The priorities p1 to p4, however, are not limited to these orders. The priorities p1 to p4 corresponding to the respective combinations of the signals S102 and S104 may have orders different from one another.

A case where the priorities p1 to p4 have orders different from one another will now be described with reference to FIG. 7. The modulated signal generating device 10 illustrated in FIG. 7 has priorities set as p1={Y1, Y2, Y3, Y4, Y5}, p2={Y2, Y4, Y1, Y5, Y3}, p3={Y1, Y3, Y5, Y2, Y4}, and p4={Y4, Y2, Y5, Y3, Y1}.

Figure 7:
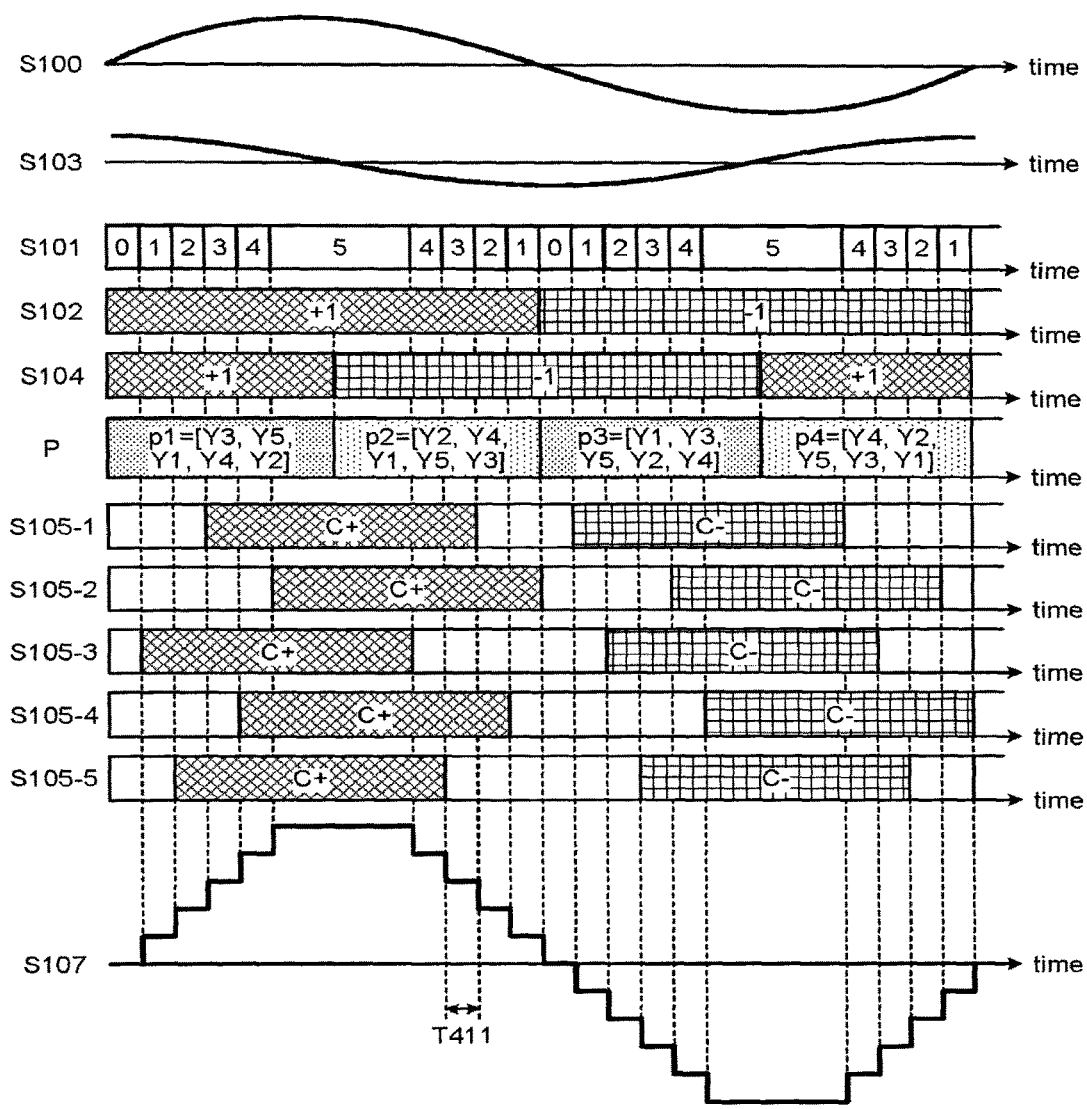
FIG. 7 is a drawing that illustrates another modification of the modulated signal generating device according to the first embodiment.

For example, in a term T411 in FIG. 7, the signal S101, which is the number of driven amplifiers 106, indicates "3", the signal S102 indicates "+1", and the signal S104 indicates "−1". The control signal generating unit 105 selects the vector signal p2={Y2, Y4, Y1, Y5, Y3} based on the combination (+1, −1) of the signals S102 and S104. The control signal generating unit 105 selects three amplifiers 106 (in this case, the first, the second, and the fourth amplifiers 106-1, 106-2, and 106-4) in decreasing order from the highest priority included in the vector signal p2 based on the signal S101 and generates the first, the second, and the fourth control signals S105-1, S105-2, and S105-4 each indicating "+C".

In this manner, without being limited to the priorities illustrated in FIG. 3, using a plurality of priorities P exerts the same advantageous effects as those of the first embodiment. The priority P may be switched according to the type of the input signal S100. For example, the priority P illustrated in FIG. 3 may be used to the case where the input signal S100 is a modulated signal with a monaural audio signal superimposed on the carrier signal, and the priority P illustrated in FIG. 6 may be used to the case where the input signal S100 is a modulated signal with a stereo audio signal superimposed on the carrier signal.

By determining zero or more amplifiers 106 to be driven based on a plurality of priorities P different from one another depending on the type of the input signal S100, the control signal generating unit 105 can select the priority P according to the characteristics of the type of the input signal S100. This configuration can further reduce the difference in the driving time between the amplifiers 106.

Second Embodiment

Figure 8:
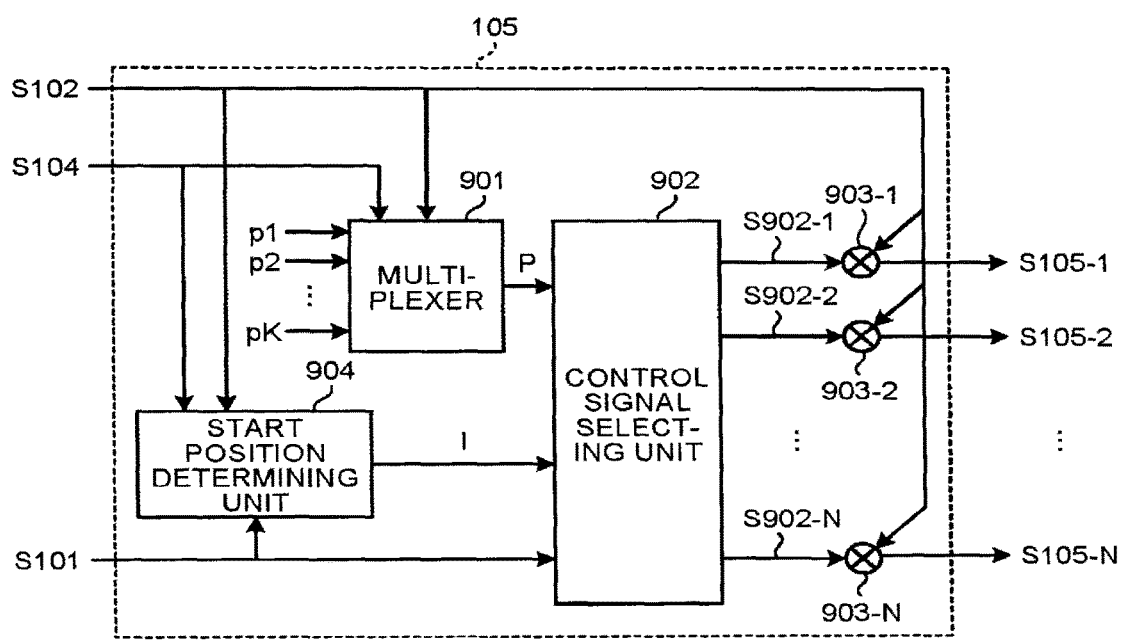
FIG. 8 is a drawing that illustrates the configuration of a control signal generating unit according to a second embodiment.
Figure 9:
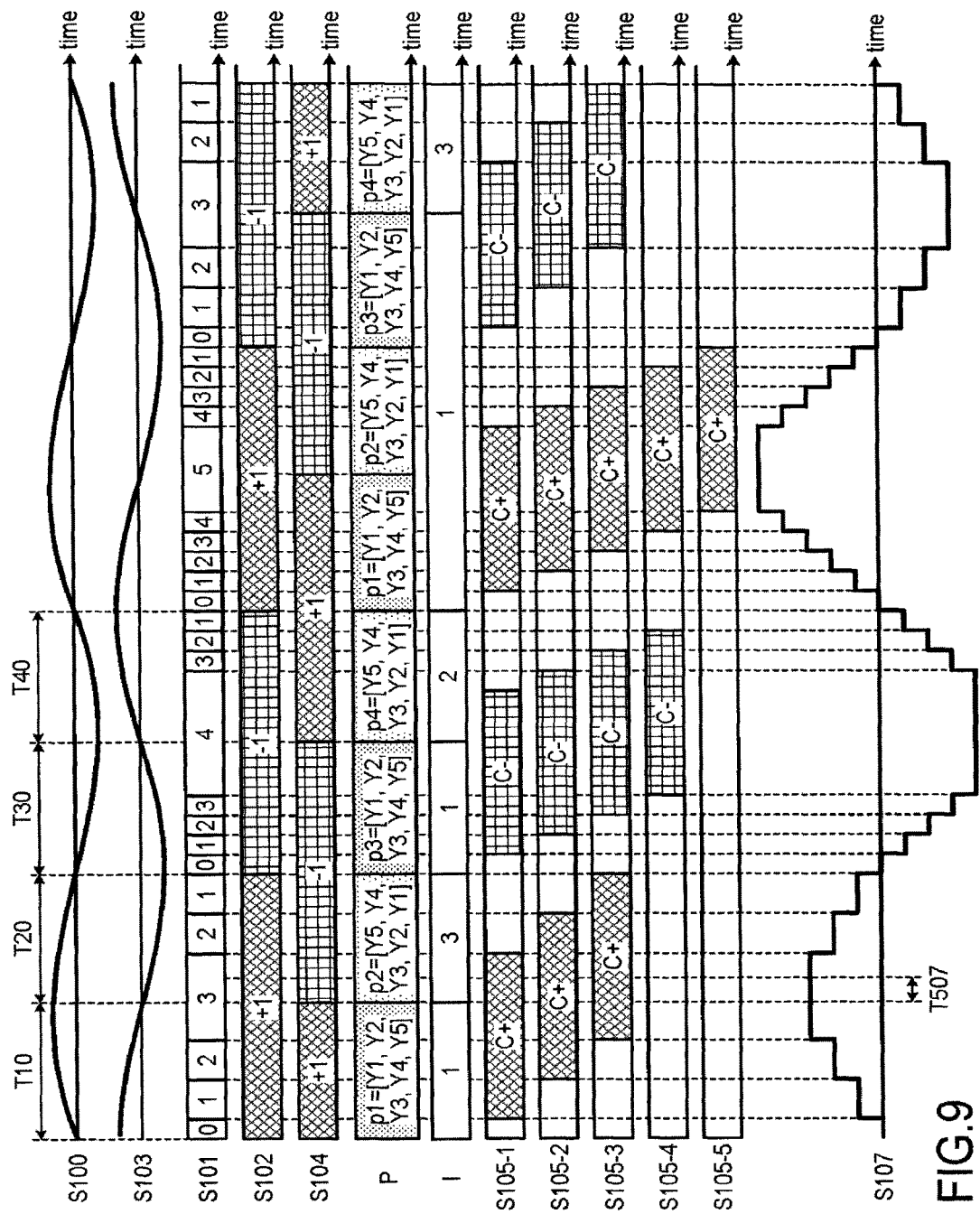
FIG. 9 is a drawing that illustrates a signal generated by each unit of a modulated signal generating device according to the second embodiment.

The modulated signal generating device 10 according to a second embodiment will now be described with reference to FIGS. 8 and 9. FIG. 8 is a drawing that illustrates the control signal generating unit 105 according to the embodiment. FIG. 9 is a drawing that illustrates a signal generated by each unit of the modulated signal generating device 10 according to the embodiment.

The modulated signal generating device 10 according to the embodiment has the same configuration and the operation as those of the modulated signal generating device 10 illustrated in FIG. 1 except that the control signal generating unit 105 additionally has a start position determining unit 904. Like numerals indicate like components, and detailed description will be thus omitted. An amplitude-modulated signal having undergone amplitude modulation is input to the modulated signal generating device 10 as the input signal S100.

The start position determining unit 904 illustrated in FIG. 8 receives inputs of the signal S101 indicating the number of amplifiers 106 driven from the determining unit 101, the signal S102 indicating the sign of an value of the input signal S100 from the first sign determining unit 102, and the signal S104 indicating a fluctuation in the value of the input signal S100 from the second sign determining unit 104. The start position determining unit 904 determines a start position I of the priority P based on the number of amplifiers 106 previously determined to be driven, the value of the input signal S100, and the fluctuation in the input signal S100.

When the control signal generating unit 105 has determined zero or more amplifiers 106 to drive based on the priorities p1 to p4 corresponding to combinations of the signals S102 and S104, the start position determining unit 904 determines the start position I to be I=1 if the signals S102 and S104 have the same sign.

Conversely, if the signals S102 and S104 have signs different from each other, the start position determining unit 904 changes the start position I of the priority P corresponding to the current combination according to the largest number of the amplifiers 106 determined based on the priority P corresponding to the last combination. The start position determining unit 904 thereafter outputs the start position I to the control signal selecting unit 902.

A method of determining the start position I will now be described in detail with reference to FIG. 9. As illustrated in FIG. 9, the control signal generating unit 105 according to the embodiment selects zero or more amplifiers 106 based on the priorities p1 to p4 corresponding to respective four combinations. In other words, the control signal generating unit 105 selects the priority p1 in a term T10, the priority p2 in a term T20, the priority p3 in a term T30, and the priority p4 in a term T40. The terms T10 to T40 are terms defined by priorities corresponding to respective different combinations of the signals S102 and S104.

The combinations of the signs of the signals S102 and S104 are (+1, +1) and (−1, −1) in the terms T10 and T30, respectively, and the signals S102 and S104 have the same sign. The start position determining unit 904 thus sets the start position I as I=1.

The combinations of the signs of the signals S102 and S104 are (+1, −1) and (−1, +1) in the terms T20 and T40, respectively, and the signals S102 and S104 have signs different from each other. The start position determining unit 904 thus changes the start position I in the priority P in the current term T20 according to, for example, the largest number among the numbers of the amplifiers 106 determined by the determining unit 101 in the last term T10.

A method of determining the start position I in the term T20 is now described in detail. The start position determining unit 904 sets, as the start position I, a value calculated by subtracting the largest value among the numbers of driven amplifiers 106 determined in the last term T10 from a value calculated by adding "1" to the number of the amplifiers 106. In other words, the start position determining unit 904 calculates the start position I using the formula I=N−ME+1 (ME is the largest value among the numbers of driven amplifiers in the last priority P. ME=1 to 5).

For example, in the term T20 in FIG. 9, "3" is the largest value among the numbers of driven amplifiers in the last term T10, and the start position is thus calculated as I=5−3+1=3. The start position determining unit 904 informs the control signal selecting unit 902 of the start position I=3.

Referring back to FIG. 8, the control signal selecting unit 902 receives an input of the vector signal p indicating the priority P from the multiplexer 901 and an input of the signal S101 indicating the number of driven amplifiers 106 from the determining unit 101. The control signal selecting unit 902 is informed of the start position I by the start position determining unit 904. The control signal selecting unit 902 thereafter selects as many amplifiers 106 as the number indicated by the signal S101 as amplifier(s) 106 to be driven in decreasing order from the I$^{th}$ highest amplifier 106 in the priority P.

How the control signal selecting unit 902 selects zero or more amplifiers 106 to drive will be described in detail with reference to a term T507 illustrated in FIG. 9. In the term T507, the signal S101, which is the number of driven amplifiers 106, indicates "3", the signal S102 indicates "+1", and the signal S104 indicates "−1". In the term T507, the start position I indicates "3".

The priority P=p2={Y5, Y4, Y3, Y2, Y1} is input to the control signal selecting unit 902 from the multiplexer 901. Because the start position I indicates "3", the control signal selecting unit 902 sets "Y3", which comes third in the priority p2, as the start position I from which the amplifier 106 is selected, and selects three amplifiers 106 in decreasing order from the third amplifier in the priority p2. In other words, the control signal selecting unit 902 selects the first to the third amplifiers 106-1 to 106-3 corresponding to "Y3", "Y2", and "Y1".

The control signal selecting unit 902 generates first to third selection signals S903-1 to S903-3 for selecting the first to the third amplifiers 106-1 to 106-3, respectively.

For example, if the number of driven amplifiers is four in the term T507, the control signal selecting unit 902 selects the first amplifier 106-1 corresponding to "Y1", which is the lowest priority, as the third amplifier and then selects the fifth amplifier 106-5 corresponding to "Y5", which is the highest priority. In other words, when the start position I is informed, the control signal selecting unit 902 changes the priority p2 into p2={Y3, Y2, Y1, Y5, Y4}.

As described above, if the signals S102 and S104 have the same sign, the start position I is set as I=1. Conversely, if the signals S102 and S104 have signs different from each other, the start position I is changed according to the maximum number of the driven amplifiers in the last term. This process can lengthen the pulse width of the control signal S105, because the order is reversed between the priorities P having the same sign for the signal S102 and having signs different from each other for the signal S104, which means that the low-priority amplifier 106 in the last term turns to the high-priority amplifier 106 in the current term.

By assigning a lower priority to the start position I according to the maximum number of the driven amplifiers in the last term, the amplifier 106 having not been selected in the last term due to its low priority, in other words, the amplifier 106 with the higher priority in the current term, is less likely to be selected. With this configuration, the same amplifier 106 is more likely to be selected in terms (for example, the terms T10 and T20) that have the same sign for the signal S102 and have signs different from each other for the signal S104. The pulse width of the control signal S105 can be thus lengthened.

As described above, the modulated signal generating device 10 according to the embodiment exerts the same advantageous effects as those of the first embodiment. Furthermore, the modulated signal generating device 10 according to the embodiment changes the start position I in the priority P in the current term according to the number of the driven amplifiers 106 in the last term. With this configuration, as illustrated in FIG. 9, the amplifier 106 having been driven in the last term can be again driven in the current term, which can lengthen the pulse width of the control signal S105. This configuration can accordingly further reduce distortion of the amplified signal S106 caused by switching.

Second Modification

Figure 10:
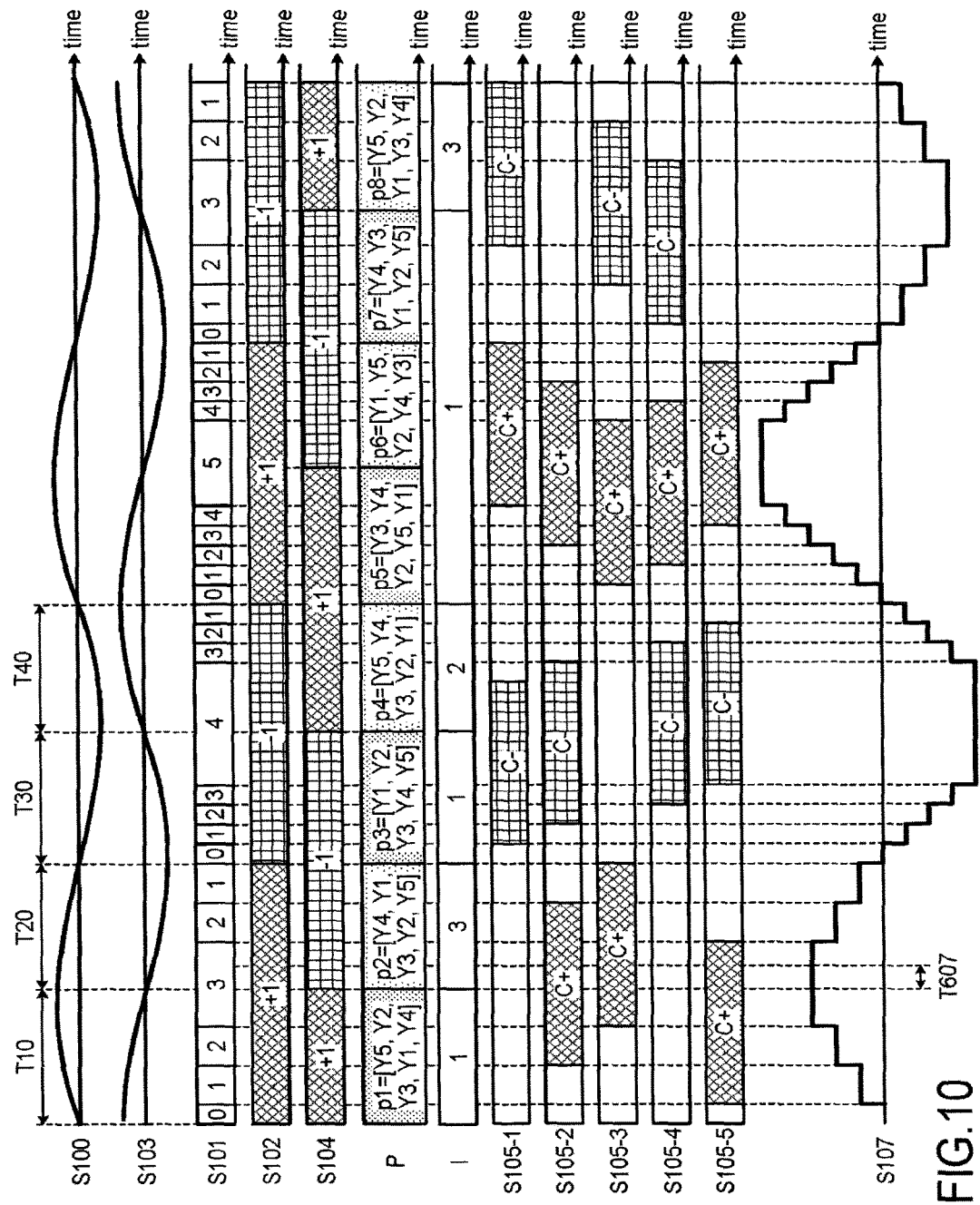
FIG. 10 is a drawing that illustrates a modification of the modulated signal generating device according to the second embodiment.

A second modification according to the embodiment will be described with reference to FIG. 10. FIG. 10 is a drawing that illustrates a signal generated by each unit of the modulated signal generating device 10 according to the modification. The configuration and the operation of the modulated signal generating device 10 according to the modification are the same as those of the modulated signal generating device 10 illustrated in FIGS. 8 and 9 except the priority P used in determining zero or more amplifiers 106 to be driven.

Similarly to the first embodiment, in the priority P indicated in the second embodiment, the priorities p1 and p3 have the same vector signal (p1=p3={Y1, Y2, Y3, Y4, Y5}), and the priorities p2 and p4 have the same vector signal (p2=p4={Y4, Y5, Y2, Y3, Y1}). The order of the vector signals p1 and p3 is different from the reverse order ({Y1, Y3, Y2, Y5, Y4}) to the order of the vector signals p2 and p4.

Conversely, the priorities P=p1 to p8 illustrated in FIG. 10 have orders different from one another for the respective terms determined based on combinations of the signal S102 and S104. Specifically, the priorities p1, p3, p5, and p7 each have orders different from one another, and the priorities p2, p4, p6, and p8 each have orders different from one another. The priority p1 has a reverse order to the order of the priority p2, and the priority p3 has a reverse order to the order of the priority p4. In other words, when the sign of the signal S104 reverses with the sign of the signal S102 unchanged, the priority P reverses. When the sign of the signal S102 reverses, the priority P has different orders.

Specifically, in the example of FIG. 10, in the term T10, the sign of the signal S102 is "+1", the sign of the signal S104 is "+1", and the priority P is p1={Y5, Y2, Y3, Y1, Y4}. In the term T20, the sign of the signal S104 reverses to be "−1", and the priority P is p2={Y4, Y1, Y3, Y2, Y5}, which is the reverse order to the order of the priority p1. In the term T30, the sign of the signal S102 reverses to be "−1". In this case, the priority p3 has an order (p3={Y1, Y2, Y3, Y4, Y5}) different from orders of the priorities p1 and p2.

How the control signal selecting unit 902 selects at least one amplifier 106 to drive will be described in detail with reference to a term 1607 illustrated in FIG. 10. In the term T607, the signal S101, which is the number of driven amplifiers 106, indicates "3", the signal S102 indicates "+1", the signal S104 indicates "−1", and the start position I indicates "3". The control signal generating unit 105 selects the priority p2={Y4, Y1, Y3, Y2, Y5} based on the combination (+1, −1) of the signals S102 and S104. The control signal generating unit 105 selects, based on the signal S101, three amplifiers 106 in decreasing order from the third highest priority included in the vector signal p2. In other words, the control signal generating unit 105 determines to drive the third, the second, and the fifth amplifiers 106-3, 106-2, and 106-5.

In this manner, without being limited to the priority P illustrated in FIG. 9, using a plurality of priorities P exerts the same advantageous effects as those of the second embodiment. The priority P is not limited to the example illustrated in FIG. 9 or FIG. 10, and the priorities illustrated in FIG. 6 and FIG. 7 may be used, for example. Alternatively, the priority P may be switched according to the type of the input signal S100. For example, the priority P illustrated in FIG. 9 may be used for the case where the input signal S100 is a modulated signal with a monaural audio signal superimposed on the carrier signal, and the priority P illustrated in FIG. 10 may be used for the case where the input signal S100 is a modulated signal with a stereo audio signal superimposed on the carrier signal.

Third Embodiment

Figure 11:
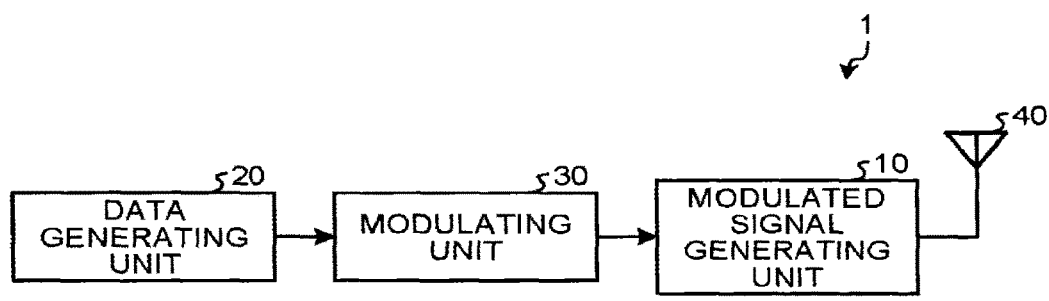
FIG. 11 is a drawing that illustrates a wireless device according to a third embodiment.

FIG. 11 is a drawing that illustrates a wireless device 1 according to a third embodiment. The wireless device 1 according to the embodiment includes a data generating unit 20, a modulating unit 30, the modulated signal generating device 10 according to the first embodiment, and an antenna unit 40. In the embodiment, the wireless device 1 includes the modulated signal generating device 10 according to the first embodiment; however, the wireless device 1 may include the modulated signal generating device 10 described in any other embodiments or modifications.

The data generating unit 20 generates transmission data to be transmitted from the wireless device 1 according to an instruction given from an upper layer (not illustrated) and outputs the generated transmission data to the modulating unit 30. The modulating unit 30 modulates the transmission data and generates a first modulated signal. For example, the modulating unit 30 in FIG. 11 performs amplitude modulation on transmission data and generates the first modulated signal. The modulating unit 30 thereafter outputs the first modulated signal to the modulated signal generating device 10.

When the first modulated signal is input, the modulated signal generating device 10 modulates the first modulated signal as the input signal S100 and generates the output signal S107. How the modulated signal generating device 10 generates an output signal has been described in the first embodiment, and the description is therefore omitted. The modulated signal generating device 10 outputs the generated output signal S107 to the antenna unit 40 as a second modulated signal.

When the second modulated signal is input, the antenna unit 40 transmits the second modulated signal via an antenna. In FIG. 11, the antenna unit 40 is configured with only an antenna; however, the configuration of the antenna unit 40 is not limited to this. For example, the antenna unit 40 may have an amplifier and a filter.

As described above, in the wireless device 1 according to the embodiment, the modulated signal generating device 10 modulates the first modulated signal. This process exerts effects of reducing harmonic components without using a band-pass filter, similarly to the first embodiment. Furthermore, the modulated signal generating device 10 of the wireless device 1 determines at least one amplifier 106 to drive based on a plurality of priorities P, thereby assuring a longer product life of the amplifier 106, reducing the size of the cooling device, and preventing distortion of the amplified signal S106 caused by switching the amplifier 106. Furthermore, the size of the wireless device 1 can be reduced with the reduction in the size of the cooling device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A modulated signal generating device that modulates an input signal and generates an output signal, the modulated signal generating device comprising:
   a plurality of amplifiers connected in parallel with one another and each configured to drive based on a control signal and to generate amplified signals;
   a combiner configured to combine the amplified signals and to obtain the output signal having a stepwise waveform;
   a determining unit configured to determine a number of amplifiers to be driven based on a value of the input signal every period shorter than a period of the input signal; and
   a control signal generating unit configured to select zero or more amplifiers to be driven from among the amplifiers, based on the number of amplifiers determined by the determining unit, the value of the input signal, and a fluctuation in the value of the input signal, and to generate the control signal for driving the selected amplifier.

2. The modulated signal generating device according to claim 1, further comprising:

a differential calculation unit configured to calculate a differential value of the input signal, wherein the control signal generating unit selects the amplifier to be driven based on a priority corresponding to a combination of a sign of the value and a sign of the differential value of the input signal.

3. The modulated signal generating device according to claim 2, wherein a priority corresponding to the combination with the differential value in a plus sign has a reverse order to an order of another priority corresponding to the combination with the differential value in a minus sign.

4. The modulated signal generating device according to claim 2, wherein priorities corresponding to the respective combinations have orders different from one another.

5. The modulated signal generating device according to claim 3, wherein priorities corresponding to the respective combinations have orders different from one another.

6. The modulated signal generating device according to claim 2, wherein the determining unit determines a plurality of numbers of amplifiers in terms defined by priorities corresponding to different combinations; and the control signal generating unit changes a start position of the priority corresponding to the combination in a current term according to a maximum number among the numbers of amplifiers determined in a last term.

7. The modulated signal generating device according to claim 3, wherein the determining unit determines a plurality of numbers of amplifiers in terms defined by priorities corresponding to different combinations; and the control signal generating unit changes a start position of the priority corresponding to the combination in a current term according to a maximum number among the numbers of amplifiers determined in a last term.

8. The modulated signal generating device according to claim 4, wherein the determining unit determines a plurality of numbers of amplifiers in terms defined by priorities corresponding to different combinations; and the control signal generating unit changes a start position of the priority corresponding to the combination in a current term according to a maximum number among the numbers of amplifiers determined in a last term.

9. The modulated signal generating device according to claim 5, wherein the determining unit determines a plurality of numbers of amplifiers in terms defined by priorities corresponding to different combinations; and the control signal generating unit changes a start position of the priority corresponding to the combination in a current term according to a maximum number among the numbers of amplifiers determined in a last term.

10. A wireless device comprising:

a signal generating unit configured to generate a transmitted signal from transmitted data;

a modulating unit configured to modulate the transmitted signal and generate a first modulated signal;

a modulated signal generating device configured to modulate the first modulated signal and generate a second modulated signal; and an antenna unit configured to transmit the second modulated signal, wherein the modulated signal generating device includes:

a plurality of amplifiers connected in parallel with each other and each configured to generate amplified signals based on a control signal;

a combiner configured to combine the amplified signals and to obtain the second modulated signal having a stepwise waveform;

a determining unit configured to determine a number of amplifiers to be driven to generate amplified signals to be combined by the combiner according to a value of the first modulated signal every period shorter than a period of the first modulated signal; and a control signal generating unit configured to select zero or more amplifiers to be driven from among the amplifiers, based on the number of the amplified signals determined by the determining unit, the value of the first modulated signal, and a fluctuation in the value of the first modulated signal, and to generate the control signal for driving the selected amplifier.

* * * * *